United States Patent
Subramani

(10) Patent No.: US 11,319,334 B2
(45) Date of Patent: May 3, 2022

(54) SITE-SELECTIVE METAL PLATING ONTO A PACKAGE DIELECTRIC

(71) Applicant: INTEL CORPORATION, Santa Clara, CA (US)

(72) Inventor: Chandramouleeswaran Subramani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 977 days.

(21) Appl. No.: 15/857,350

(22) Filed: Dec. 28, 2017

(65) Prior Publication Data

US 2019/0202845 A1  Jul. 4, 2019

(51) Int. Cl.

| | | |
|---|---|---|
| *C07F 7/18* | (2006.01) | |
| *C07F 7/08* | (2006.01) | |
| *C23C 16/18* | (2006.01) | |
| *H01L 23/31* | (2006.01) | |
| *H01L 21/822* | (2006.01) | |
| *H01L 23/498* | (2006.01) | |
| *C23C 18/52* | (2006.01) | |
| *C23C 18/18* | (2006.01) | |

(52) U.S. Cl.
CPC ............ *C07F 7/1804* (2013.01); *C07F 7/081* (2013.01); *C23C 16/18* (2013.01); *C23C 18/52* (2013.01); *H01L 21/822* (2013.01); *H01L 23/3128* (2013.01); *H01L 23/49811* (2013.01); *H01L 23/49866* (2013.01); *C23C 18/1879* (2013.01)

(58) Field of Classification Search
CPC ........ C07F 7/1804; C07F 7/081; C23C 18/52; C23C 16/18; C23C 18/1879; H01L 23/3128; H01L 21/822; H01L 23/49811; H01L 23/49866
See application file for complete search history.

(56) References Cited

U.S. PATENT DOCUMENTS

| | | | | |
|---|---|---|---|---|
| 2005/0270820 | A1* | 12/2005 | Mobley | B82Y 10/00 365/100 |
| 2009/0056994 | A1* | 3/2009 | Kuhr | C23C 18/1653 174/259 |
| 2011/0168669 | A1* | 7/2011 | Cho | C23C 18/1696 216/37 |
| 2016/0245772 | A1* | 8/2016 | Anderson | H01B 1/04 |
| 2017/0058401 | A1* | 3/2017 | Blackwell | H01L 21/76897 |
| 2017/0168026 | A1* | 6/2017 | Morton | H03H 3/013 |
| 2017/0179019 | A1* | 6/2017 | Alur | H01L 23/528 |

FOREIGN PATENT DOCUMENTS

| | | | |
|---|---|---|---|
| WO | WO 215/147843 | * | 10/2015 |
| WO | WO 2017/095485 | * | 6/2017 |

OTHER PUBLICATIONS

Asakura et al., "Fabrication of built-in copper microstructures on epoxy resin" Microelectronic Eng., 75 (2004) 375-385 (Year: 2004).*

* cited by examiner

*Primary Examiner* — Ahmed N Sefer

(74) *Attorney, Agent, or Firm* — Essential Patents Group, LLP.

(57) ABSTRACT

An integrated circuit (IC) package comprising a substrate having a dielectric, a first structure over at least a portion of the dielectric, the first structure comprising a molecular compound having a ligand coordinating moiety and a second structure over at least a portion of the first structure, the second structure comprising a metal, wherein the first structure is chemically bonded to the dielectric.

14 Claims, 7 Drawing Sheets

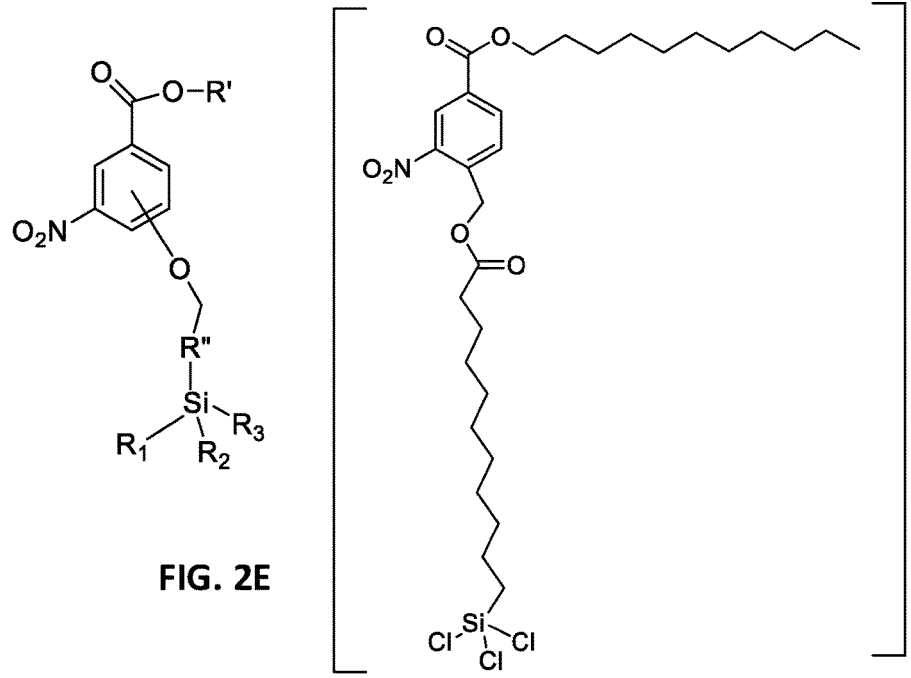
FIG. 2E
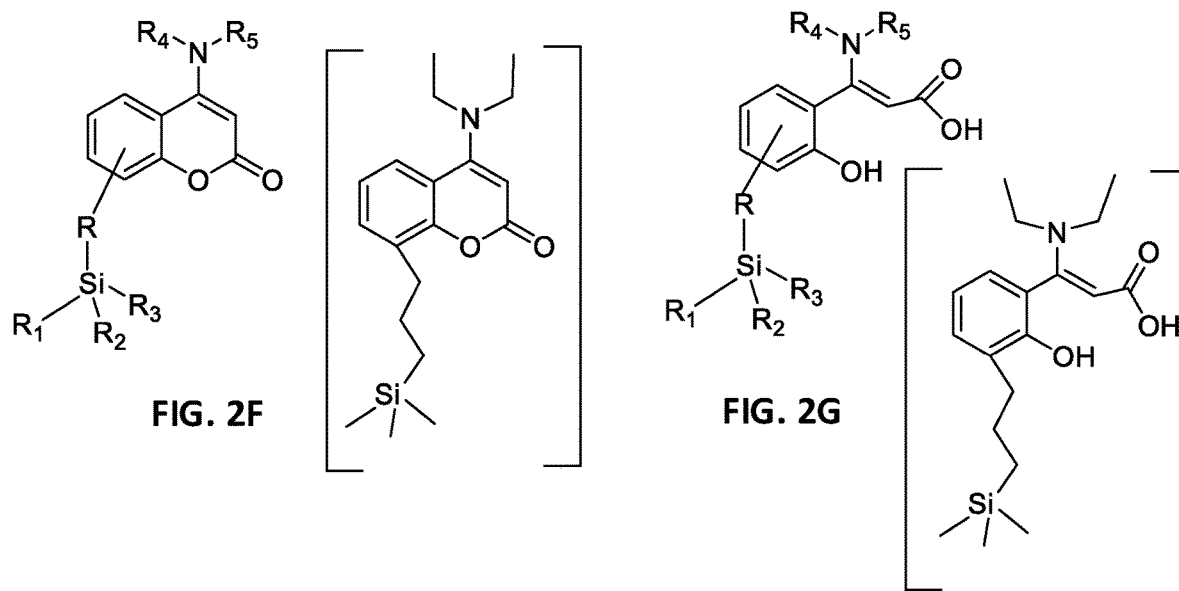
FIG. 2F
FIG. 2G
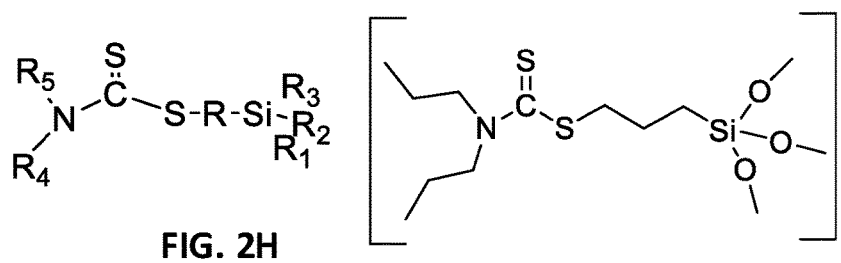
FIG. 2H

SITE-SELECTIVE METAL PLATING ONTO A PACKAGE DIELECTRIC

BACKGROUND

Packaging for microelectronic devices is facing increasing demand for low cost manufacturing processes. Currently, substrate costs account for the highest costs in processor packaging. Reduction in the number of process steps is one way to lower manufacturing costs.

BRIEF DESCRIPTION OF THE DRAWINGS

The embodiments of the disclosure will be understood more from the detailed description given below and from the accompanying drawings of various embodiments of the disclosure, which, however, should not be taken to limit the disclosure to the specific embodiments, but are for explanation and understanding only.

FIGS. 2A-2H illustrate exemplary tether molecule molecular structures, according to some embodiments of the disclosure.

DETAILED DESCRIPTION

Figure 1A:
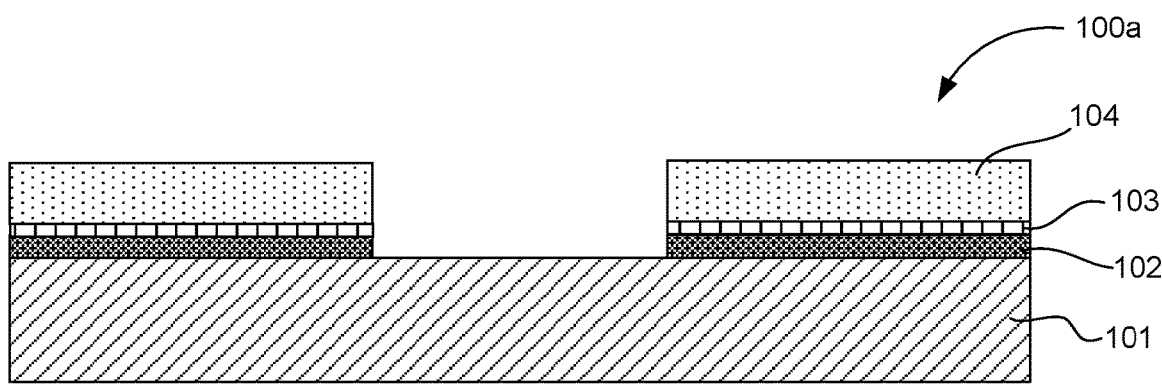
FIG. 1A illustrates a cross-sectional view of an Integrated Circuit (IC) package substrate having a positive metallization pattern, where non-metallized regions of the ligand coordinating layer are deactivated by light exposure, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "moiety" generally refers to a portion or a functional group of an individual molecule. The term "functional group" or "group" generally refers to a recognized moiety or arrangement of atoms within a molecule that is known to have specific properties. For example, an amino group ($-NH_2-$) is a functional group.

Here, the term "ligand" generally refers to metal ions that form complexes with molecules having a ligand coordinating functional groups. Groups such as carboxylic acids ($-COOH$), hydroxyls ($-OH$), and amines (e.g., $-NH_2$) are examples of ligand coordinating groups.

Here, the term "complex" generally refers to a supramolecular bond between a metal ion ligand and one or more ligand coordinating groups, where the metal ion may be displaced by acids. The term "coordination bond" generally refers to a bond between empty p and/or d orbitals of a metal ion or atom and donated lone pair electrons of an electronegative atom (e.g., oxygen, nitrogen) of a ligand coordinating group.

In current package assembly processes, metallization is performed by deposition of copper or another suitable metal through a lithographically-defined photoresist mask (photomask). This is typically done by a process of coating a photoresist layer onto a package substrate, followed by photolithographic patterning and developing to make openings in the resist layer through which a metal is deposited. The photoresist may be a laminated dry film resist or a liquid resist deposited by spraying or spin coating. A metal seed layer may be present on the substrate surface prior to the formation of the photomask.

Once the photomask is patterned, copper (or other suitable metals) may be electroplated through the patterned openings in the photomask. In this case, the seed layer acts as a cathode and is connected to a potentiostat or other power source. Alternatively, copper may be plated onto the exposed substrate by electroless deposition processes. In this case, the seed layer comprises a monolayer of catalytic metal ions or atoms. Metals that exhibit catalytic behavior toward electroless deposition comprise palladium, tin, ruthenium, rhodium, silver, osmium, to name a few. The catalytic activity is present in ions or atoms of these metals.

In conventional metallization processes, the creating of a photomask requires photoresist deposition, photolithography by light exposure through a pattern mask, and development to produce the pattern of openings in the photoresist. These processes are labor intensive and require a significant dedication of time and resources. Electroplating can have issues with uniformity of plating thicknesses into small mask features over the length and width of a panel supporting multiple nascent package units that are processed en mass. The problem of plating uniformity becomes more acute as package metal layer feature size decreases as demand for smaller high-performance ICs increases.

Described herein is a method for producing an IC package metallization by a non-lithographic site-selective electroless deposition process, and IC package metallization structures produced by the described method. In embodiments of the described method, a ligand coordinating layer is formed by chemisorption of molecules of a tether compound on the surface of the package substrate dielectric. Molecules of the tether compound are reacted with the dielectric material to form a ligand coordinating layer on the substrate dielectric surface. By exposure to Ultra-Violet (UV) light though a mask pattern, the ligand coordinating layer may be patterned into active and inert regions. The active regions are receptive to complexing ions of metals exhibiting catalysis of electroless deposition. The ligand coordinating layer tethers the complexed metal ions to the dielectric surface, forming a patterned layer of catalytic metal ions over the surface. The patterned layer of metal ions promotes site-selective electroless deposition of metallization materials such as copper (site-selective electroless metallization) on the active regions of ligand coordinating layer. In some embodiments, the metal ions are reduced to metal atoms prior to the site-selective electroless metallization of the substrate dielectric.

In the described embodiments, the tether molecules comprise an anchor moiety. The anchor moiety forms covalent bonds with exposed functional groups on the surface of the dielectric. The tether molecules also comprise a ligand coordinating moiety, separated from the anchor moiety by an inert portion of the tether molecule. The ligand coordinating moiety of the tether molecule is capable of forming complexes with metal ions. When a tether molecule is anchored to a surface, a metal ion that is complexed with the ligand coordinating group is tethered to the dielectric surface. By forming complexes with the tether molecules, a layer of chemisorbed metal ions may be formed over or within the ligand coordinating layer.

Exposure to deep UV light (e.g., λ less than 300 nm) through a shadow mask, patterns the ligand coordinating layer to delineate traces and bond pads as well as other metallization structures on the substrate dielectric. Light exposure activates or deactivates regions of the ligand coordinating layer toward metal complexation. In some embodiments, the ligand coordinating layer comprises chemisorbed molecules that are structural precursors to active tether molecules. In some embodiments, the precursor molecules comprise a protective or masking moiety bonded to the ligand coordinating group of the tether molecule, and are chemical derivatives of the tether molecules. Deprotection may result from photolysis of a masking moiety bonded to the ligand coordinating group. Active regions of the patterned ligand coordinating layer comprise tether molecules that readily form coordination bonds with catalytic metal ions.

Metallization structures are subsequently formed over the catalytic metal ions or atoms retained within the activate regions of the ligand coordinating layer. In regions shielded from illumination, the ligand coordinating layer comprises intact precursors of the tether molecules that do not readily form metal complexes. In some embodiments, the ligand coordinating layer having regions activated by light illumination acts as a positive photoresist, having a positive mask pattern transferred to the metallization pattern.

In some embodiments, the ligand coordinating layer comprises tether molecules that do not comprise masking moieties. These species of tether molecules do not require a-priori activation by light. Exposure to deep UV light causes deactivation of these molecules by cleaving the ligand coordinating group from the anchor moiety attached to the dielectric surface, according to some embodiments. In some embodiments, the entire molecule is debonded from the dielectric surface. A negative image of the pattern mask is thus formed in the ligand coordinating layer, where metallization structures appear over unilluminated regions of the ligand coordinating layer. The illumination deactivates regions of the ligand coordinating layer so that no catalyst metal ions are adsorbed in the deactivated regions. The resulting pattern is a positive mask image.

The described method further comprises operations for site-selective electroless deposition of copper or other suitable metals. The patterned ligand coordinating layer is exposed to metal catalyst ions. In some embodiments, metal catalyst ions are in solution, and the patterned ligand coordinating layer is immersed in the metal catalyst ion solution for a specified period to allow the ions to form complexes with the ligand coordinating group. Metallization by electroless deposition only occurs where catalytic metal ions, such as $Pd^{2+}$, are tethered to the substrate dielectric surface, viz., in the patterned active regions of the ligand coordinating layer.

Therefore, the described method accomplishes site-selective metallization of the substrate dielectric without the use of a photoresist deposition mask, and simplifies the metal deposition process by not requiring a lithographically-defined seed layer, essential for galvanic electroplating. The metallization structures obtained by the described method may be grown to arbitrary thickness. The method will be described in detail below.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1A illustrates a cross-sectional view of package substrate 100a having a negative metallization pattern, where non-metallized regions of the ligand coordinating layer are deactivated by light exposure, according to some embodiments of the disclosure.

In FIG. 1A, package substrate 100a comprises dielectric layer 101, ligand coordinating layer 102, catalytic layer 103 and metallization layer 104. Ligand coordinating layer 102 comprises tether molecules forming a thin layer over dielectric layer 101. In some embodiments, the tether molecules form a monolayer over dielectric layer 101. In some embodiments, other inert organic molecules are interspersed in ligand coordinating layer 102.

Ligand coordinating layer 102 comprises tether compounds such as, but not limited to, (chlorosilyl-R—) pyridine species, (trialkoxysilyl-R—) pyridine species, (alkoxysilylthio-R—) pyridine species, methoxysilyl-R—(N,N-dialkyl-dithiocarbamates, and ((R$_1$,R$_2$,R$_3$)-silyl-R-uriedo) terpyridines, where R$_1$, R$_2$ and R$_3$=chloro- or alkoxy- (e.g., (4'-(4-(3-(triethoxysilyl)uriedo)phenyl) 2-2': 6'-2'' terpyridine). In some embodiments, R represents an alkyl chain, structurally represented by —(CH$_2$)$_n$—, where n is an integer between 1 through 10, inclusive. In some embodiments, R is any one of a methyl group, an ethyl group, a propyl group, a butyl group or a pentyl group. Generic forms of chemical structures of exemplary compounds are shown in FIG. 2.

Referring back to FIG. 1A, in some embodiments, the trialkoxy- (e.g., alkoxy=methoxy, ethoxy and propoxy) or trichlorosilyl moieties are not present on the silyl moiety when the silyl moiety serves as the anchor group and is bound to dielectric 101. In some embodiments, the anchor group is bonded to substrate dielectric 101 through a Si—O—Si linkage, or a Si—O—C linkage, where at least one Si—Cl bond or Si-alkoxy bond is cleaved. In some embodiments, silyl groups are crosslinked between adjacent tether molecules.

In some embodiments, the ligand coordinating moiety of the tether molecules comprises moieties such as, but not limited to, a carboxylic group (—COOH), a primary amino group (RNH$_2$), a secondary amino group (R$_2$NH), a tertiary amino group (R$_3$N), an amido group (R—NHCOO—R), a hydroxyl group (—OH), an oxo group (R$_2$C=O), an oxime group (R$_2$C=N—OH), a pyridine ring, a terpyridine group, a phosphoryl group (R$_3$P=O), a sulfuryl group (R$_2$SO$_2$), a sulfhydryl group (—SH) and a nitro group (—NO$_2$). R is any molecular fragment. In some embodiments, R comprises both aromatic and aliphatic hydrocarbon portions.

In some embodiments, substrate dielectric 101 comprises organic and inorganic compounds. Examples of organic compounds include epoxy compounds, which contain ester linkages among other types of oxygen-containing groups, such as hydroxyl groups. Inorganic compounds comprise silicates and silica microparticles having exposed silanol groups (—SiOH) on their surfaces. In some embodiments, the surface of substrate dielectric 101 comprises exposed hydroxyl and silanol groups. During chemisorption of the tether molecules of ligand coordinating layer 102, these groups may undergo condensation reactions with chlorosilanes and alkoxysilanes to form covalent Si—O—C and Si—O—Si linkages with exposed surface hydroxyl and silanol groups on substrate dielectric layer 101, according to some embodiments. In some embodiments, ligand coordinating layer 102 is a monolayer. In some embodiments, ligand coordinating layer 102 is a self-assembled monolayer.

In some embodiments, tether molecules in ligand coordinating layer 102 may be deactivated by exposure to ultraviolet (UV) light, where the tether molecules are photolyzed to remove at least a portion of the tether molecule containing the ligand coordinating moiety. In some embodiments, the entire tether molecule is removed from the surface by photolyzing the anchor group. In some embodiments, ligand coordinating layer 102 is patterned into a metallization template by exposure to UV light through a shadow mask.

Active regions of ligand coordinating layer 102 are complexed with metal ions or metal atoms. The complexed metal ions or atoms are tethered to the surface of substrate dielectric 101 by ligand coordinating layer 102, forming catalytic layer 103. In some embodiments, catalytic layer 103 is substantially a monolayer. In some embodiments, catalytic layer interpenetrates ligand coordinating layer 102. In some embodiments, complexed metal ions or metal atoms exhibit catalytic activity towards electroless deposition. Catalytic layer 103 comprises catalytic metals such as, but not limited to, palladium, tin, copper, nickel, osmium, iridium, rhodium, ruthenium, cobalt, and platinum. In some embodiments, the catalytic metals have an oxidation state other than zero (e.g., ionic Pd$^{2+}$). In some embodiments, the catalytic metal ions are chemically reduced to catalytic metal, and have an oxidation state of zero (e.g., metallic)Pd$^0$.

Metallization layer 104 is disposed over the stack comprising catalytic layer 103 and ligand coordinating layer 102. In some embodiments, metallization layer 104 comprises copper, or alloys of copper, silver or silver alloys, nickel or nickel alloys, gold or gold alloys, aluminum or aluminum alloys, iron or iron alloys, cobalt or cobalt alloys. Metallization layer 104 has a thickness ranging between 100 nm and 10 microns, in accordance with some embodiments.

In the illustrated embodiment, ligand coordinating layer 102 performs as a positive photoresist, where the metallization pattern is a positive image of the shadow mask opaque pattern. Metallization structures in metallization layer 104 occur in the unexposed areas of ligand coordinating layer 102, as occurs with a traditional positive photoresist resin. The metal pattern occurs in regions of the ligand coordinating layer is active, containing intact tether molecules anchored to substrate dielectric 101. Catalytic layer 103 is substantially superimposed over active regions of ligand coordinating layer 102, as the ligand coordinating moiety tethers catalytic layer to substrate dielectric 101. Illuminated regions are deactivated in that no molecules comprising a ligand coordinating group are present.

Figure 1B:
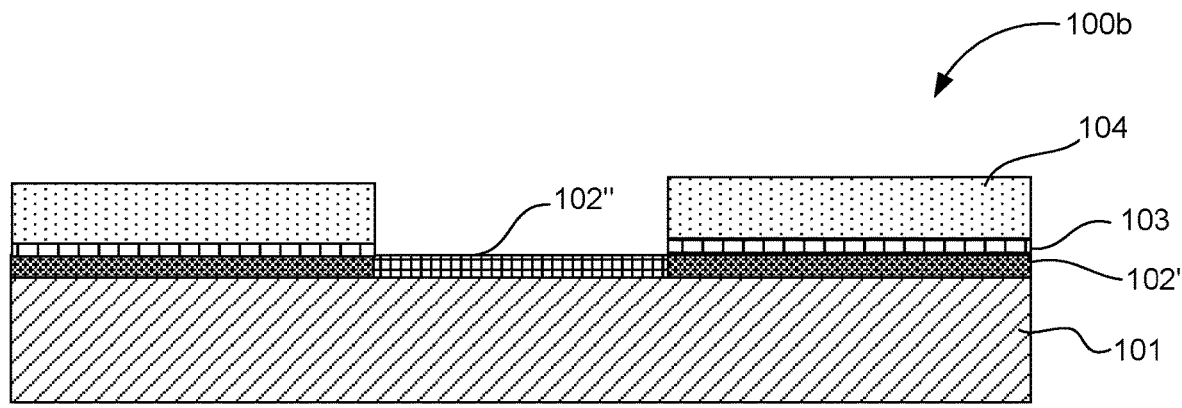
FIG. 1B illustrates a cross-sectional view of an IC package substrate having a negative metallization pattern, where metallized regions of the ligand coordinating layer are activated by light exposure, according to some embodiments of the disclosure.

FIG. 1B illustrates a cross-sectional view of package substrate 100b having a negative metallization pattern, where metallization occurs over regions of the ligand coordinating layer that are activated by light exposure, according to some embodiments of the disclosure.

In FIG. 1B, package substrate 100b comprises substrate dielectric 101, inactive ligand coordinating sublayer 102', comprising precursor tether molecules having protected ligand coordinating groups, activated ligand coordinating sublayer 102'' comprising tether molecules having deprotected ligand coordinating groups, catalytic layer 103 and metallization layer 104. In some embodiments, the precursor tether molecules are chemical derivatives of the active form of the tether molecules.

Ligand coordinating sublayer 102' comprises tether molecules having protection moieties masking ligand coordinating moieties such as, but not limited to, trialkoxyalkyl-4-N,N-dialkylaminocoumarins (e.g., 8-(3-trialkoxyoxypropyl)-4-N,N-dialkylaminocoumarin), alkyl (trichlorosilyl-1-oxoalkyloxymethyl) nitrobenzoates, carbamic acid esters (e.g., (4,5-dialkoxybenzyl) 3-(trialkoxysilanylalkyl) carbamate.

In some embodiments, the alkyl moiety represents an alkyl chain, structurally represented by —$(CH_2)_n$—, where n is an integer between 1 through 10, inclusive. In some embodiments, the alklyl moiety is any one of a methyl group, an ethyl group, a propyl group, a butyl group or a pentyl group. Generic forms of chemical structures of exemplary compounds are shown in FIG. 2.

Referring back to FIG. 1B, in some embodiments, the trialkoxy- (e.g., alkoxy=methoxy, ethoxy and propoxy) or trichlorosilyl moieties are not present on the silyl moiety when the silyl moiety serves as the anchor group and is bound to dielectric 101. In some embodiments, the anchor group is bonded to substrate dielectric 101 through a Si—O—Si linkage, or a Si—O—C linkage, where at least one Si—Cl bond or Si-alkoxy bond is cleaved. In some embodiments, silyl groups are crosslinked between adjacent tether molecules.

Ligand coordinating sublayer 102' comprises activated tether molecules, where ligand coordinating groups are deprotected by light exposure and available to form complexes with metal ions. In some embodiments, ligand coordinating sublayer 102" comprises the precursor species to the active form of the tether molecule. An exemplary precursor tether molecule species having a protected ligand coordinating group is 7-N-trimethoxysilylethyl, N-ethylaminocoumarin (FIG. 2E).

The functional group is an acid anhydride in the form of a heterocyclic ring fused with the benzene ring. The nascent ligand coordinating group is a carboxylic acid, inactive to complexation in the anhydride form of the precursor. Exposure to light photolyzes the heterocyclic ring by cleaving the bond between the oxygen heteroatom and the carbonyl, or the bond between the benzene ring and the oxygen heteroatom. In the presence of water, the acid anhydride is effectively hydrolyzed by a photoinitiation process, and the active form of the tether molecule is 1-hydroxyphenylpropenoic acid (FIG. 2F).

In some embodiments, ligand coordinating sublayers 102' and 102" are monolayers. In some embodiments, ligand coordinating sublayers 102' and 102" are self-assembled monolayers.

FIGS. 2A-2H illustrate exemplary tether molecule molecular structures, according to some embodiments of the disclosure. For each molecule, the generic structure is shown, along with an adjacent structure of an exemplary species in brackets. In the generic structures, R represents alkyl moieties, according to some embodiments. $R_1$, $R_2$ and $R_3$ represent chloro (—CO, methoxyl (—$OCH_3$), ethoxyl (—$OC_2H_5$), and propoxyl (—$OC_3H_7$) groups on the silane moiety. In some embodiments, $R_3$ and $R_4$ represent alkyl chain groups having the structure (—$CH_2$—)$_n$, where n=1-20 (integers) inclusive. In some embodiments, aryl groups, heteroatoms and functional groups are included in $R_1$-$R_5$ moieties.

Figure 2A:
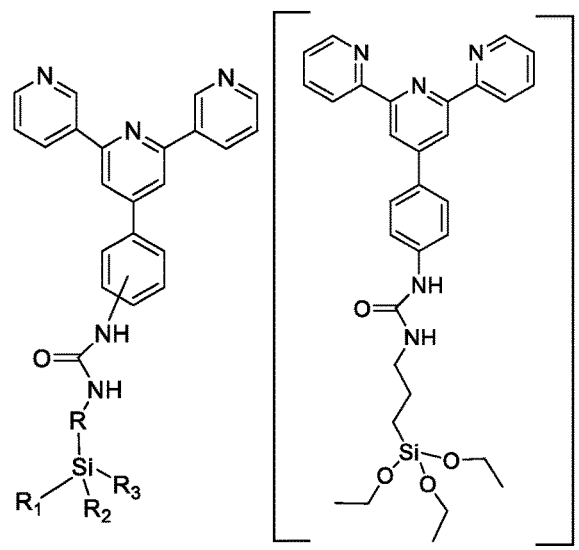

FIG. 2A illustrates the structure of 4'-(4-(3-(triethoxysilylpropyl)urieido)phenyl) 2-2': 6'-2" terpyridine (in brackets), a species of the generic (trialkoxysilylalkyl)urieido) phenyl) 2-2': 6'-2" terpyridines. The ligand coordinating group comprises the terpyridine moiety, and the anchor group comprises the triethoxysilane moiety. In some embodiments, the tether molecule of FIG. 2A is in the active form is deactivated by light exposure, cleaving the terpyridine moiety.

Figure 2B:
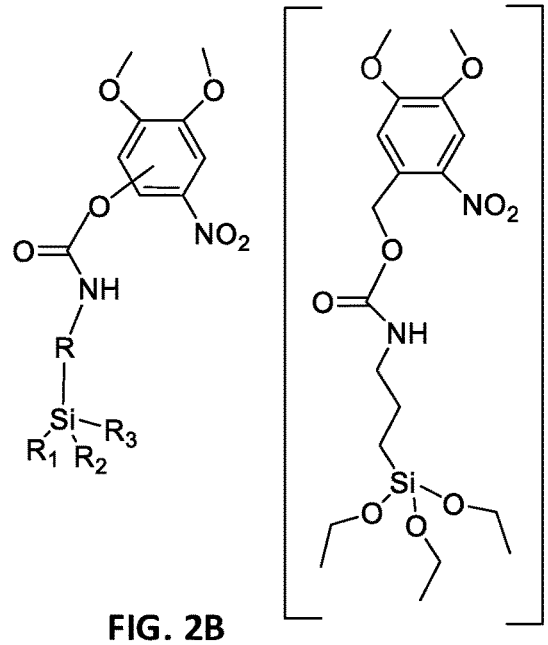

FIG. 2B illustrates the structure of 4, 5-dimethoxynitrobenzyl-3-(triethoxysilanylpropyl) carbamate, (in brackets), a species of carbamic acid ester (on the left of the brackets). In some embodiments, the tether molecule of FIG. 2B is in the active form as shown. The ligand coordinating group comprises the carbamate segment (—$COONH_2$—) of the linear portion of the molecule and the nitro group on the benzene ring. The anchor group comprises the triethoxysilyl moiety. Exposure to UV light may deactivate the molecule by cleaving a portion comprising the ligand coordinating group, leaving behind a portion of the molecule comprising the silyl moiety.

Figure 2C:
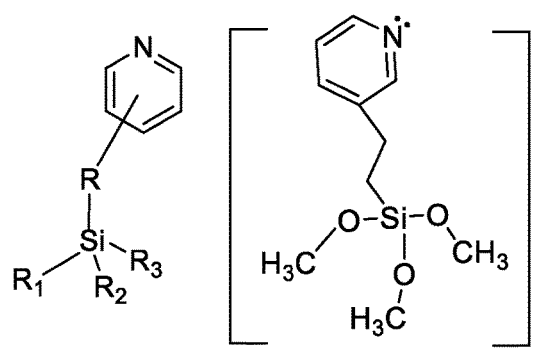

FIG. 2C illustrates the structure of 3-(2-trimethoxysilanylethyl)pyridine (in brackets), a species of the generic trialkoxysilanylalkylpyridines (left of brackets). This class of tether molecules comprises other substitutional isomers of the pyridine ring that may be substituted for the example shown in FIG. 2C, according to some embodiments. In some embodiments, one or more chloro groups (—Cl) are substituted for the alkoxy groups in the silanyl moiety. In some embodiments, the tether molecule of FIG. 2C is in the active form as shown. The ligand coordinating group comprises the pyridyl moiety. The anchor group comprises the trimethoxysilyl moiety. Exposure to UV light may deactivate the molecule by cleaving a portion comprising the pyridyl moiety, leaving behind the silyl moiety.

Figure 2D:
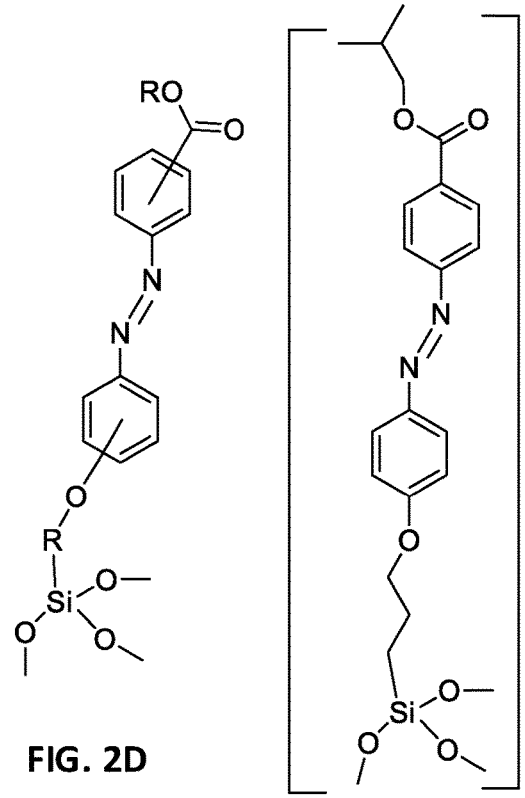

FIG. 2D illustrates the structure of decyl 4-(trichlorosilyl-1-oxoundecyloxymethyl) 3-nitrobenzoate (in brackets), a species of the generic alkyl(trichlorosilyl-1-oxoalkyloxymethyl) nitrobenzoates (shown left of brackets). In some embodiments, the decyl alkyl chain of the carboxylic ester group is substituted by other hydrocarbons. In some embodiments, other substitutional isomers of the nitro group (—$NO_2$) and the oxymethyl group (—$CH_2O$—) are substituted for the example shown in FIG. 2D. In some embodiments, the tether molecule is in the inactive form as shown, where the carboxylic acid group, which is part or all of the ligand coordinating group, is protected by the decyl alkyl chain. Deprotection of the carboxylic acid group activates the tether molecule to form coordination bonds with metal ions. In some embodiments, the nitro group and ester linkage between the methylbenzene ring and the trichlorosilylundecyl group form a ligand coordination moiety in addition to the carboxylic acid moiety. Exposure to UV light may activate the molecule by cleavage of the highly hydrophobic decyl chain, deprotecting the carboxylic acid group.

FIG. 2E illustrates the structure of 8-(3-trimethoxypropyl)-4-N, N-diethylaminocoumarin (in brackets), a species of the generic (3-trialkoxyalkyl)-4-N, N-dialkylaminocoumarin isomers (left of brackets). The anchor group comprises the trimethoxysilyl moiety. In some embodiments, chloro (—Cl) groups are substituted for the methoxy ($CH_3O$—) groups on the silane. In some embodiments, the tether molecule as depicted in FIG. 2E is substantially inactive toward complexation with metal ions. Exposure to UV light in the presence of water may open the heteroring by engendering hydrolysis of the cyclic ester linkage, forming an alcohol and carboxylic acid in close proximity. The open ring structure is shown in FIG. 2F.

FIG. 2F illustrates the structure of 1-[(1-N, N-diethylamino-3-carboxypropenyl)]-6-(3-trimethoxysilylpropyl) phenol (in brackets). The structure is open ring form of the structure shown in FIG. 2E, and comprises isomers of the closed ring form of FIG. 2E. In the open ring form, the tether molecule is active toward complexation of metal ions. The ligand coordinating group may comprise the carboxylic group, phenolic hydroxyl group and the amino group.

FIG. 2G illustrates the structure of N, N-diethyl-S-3-(trimethoxysilyl)propyl dithiocarbamate (in brackets), a species of the generic trialkoxysilylalkyl dithiocarbamates. In some embodiments (left of brackets), the tether molecule is in the active form as shown. The ligand coordinating group may comprise the carbamate linkage ($R_2N—CS_2—$), comprising electronegative nitrogen and sulfur atoms having lone pairs of electrons available for complexation with metal ions. The anchor group may comprise the trimethoxysilyl group. Exposure to UV light may deactivate the molecule by cleaving the ligand coordinating group from the anchor group.

FIGS. 3A-3E illustrate a method for site-selective metallization of an IC package substrate 100b by site-selective metallization layer structure over an activated ligand coordinating layer. FIGS. 3A-3E and the accompanying description illustrate site-selective metallization using precursor tether molecules to form the ligand coordinating layer, however, the method may be modified for use with non-precursor tether molecules, according to some embodiments of the disclosure.

Figure 3A:
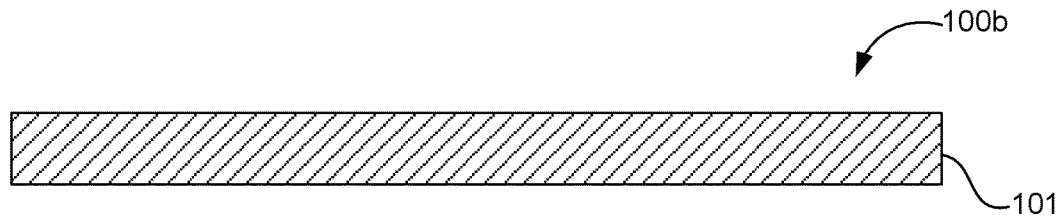
FIGS. 3A-3E illustrate a method for metallization of an IC package substrate by site-selective metallization layer structure over an activated ligand coordinating layer.

In FIG. 3A, IC package substrate 100b is received comprising a dielectric layer. In the illustrated embodiment, the surface dielectric layer 101 is depicted for clarity. Substrate dielectric layer 101 may comprise epoxy resins, rich in polyethers and hydroxyl groups. In some embodiments, substrate dielectric layer 101 comprises silica filler, having exposed silanol groups at the surface of the filler particles. In some embodiments, the surface of package substrate dielectric layer 101 is prepared by oxidation of the surface by various methods to increase the concentration of exposed surface silanol and hydroxyl groups to render the surface receptive to formation of a ligand coordinating layer by covalent bonds formed with anchor groups of the tether molecules within the ligand coordinating layer. In some embodiments, package substrate dielectric layer 101 is treated by an oxygen plasma. In some embodiments, package substrate dielectric layer 101 is treated by exposure to UV light. In some embodiments, package substrate dielectric layer 101 is exposed to hydrogen peroxide.

Figure 3B:
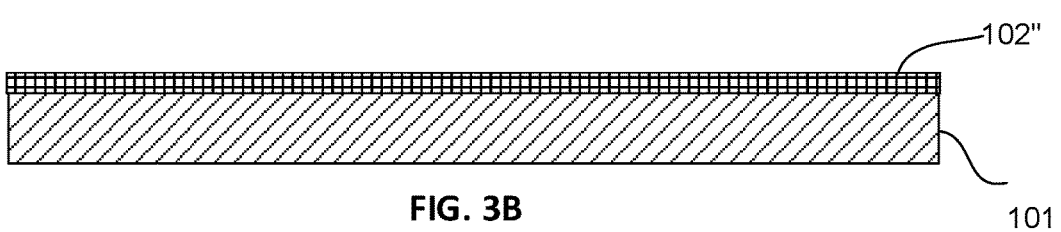

In FIG. 3B, package substrate dielectric 101 is coated with ligand coordination layer 102". As described above, ligand coordination layer 102" comprises precursor tether molecules such as, but not limited to, 8-(3-trialkoxyalkyl)-4-N,N-dialkylaminocoumarins (e.g., 8-(3-trimethoxypropyl)-4-N,N-diethylaminocoumarin), alkyl(trichlorosilyl-1-oxoalkyloxymethyl) nitrobenzoates, carbamic acid esters (e.g., (4,5-dimethoxybenzyl) 3-(triethoxysilanylpropyl) carbamate). The aforementioned compounds have molecular structures comprising a ligand coordinating group masked by a protecting group and an anchor group comprising chlorosilane or alkoxysilane groups, described in detail above. The aforementioned molecules are inactive toward complexation with metal ions.

In some embodiments, ligand coordinating layer 102" is formed by solution phase chemisorption of precursor tether molecules. An example of such a procedure is immersion of package substrate 100b in a solution comprising an organic solvent (e.g., ethanol, isopropanol, toluene) of a chosen tether molecule at elevated temperatures (e.g., 50° C.-60° C.), for extended periods (e.g., 1 hour). In some embodiments, anchor groups comprising chlorosilane or alkoxysilane groups form silicon-oxygen-carbon or silicon-oxygen-silicon linkages with package dielectric 101. In some embodiments, surface reaction to form covalent bonds between the tether molecules and package dielectric 101 is a nucleophilic attack by surface hydroxyl groups or silanol groups, displacing methoxy groups or chloro groups on the silyl moiety. In some embodiments, a baking step is necessary to complete the chemisorption process, where package substrate is rinsed and baked at 120° C. for several minutes. In some embodiments, ligand coordination layer 102" is a monolayer. In some embodiments ligand coordination layer 102" is a self-assembled monolayer. In some embodiments, ligand coordinating layer 102" is formed by chemical vapor deposition of the precursor tether molecules.

Figure 3C:
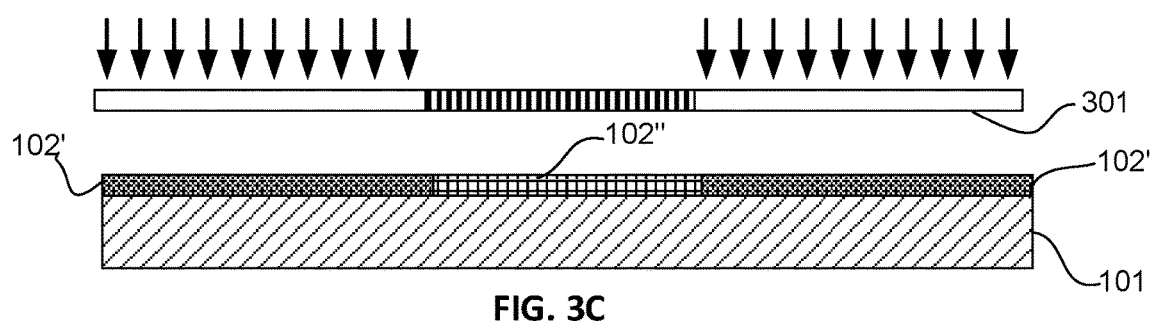

In FIG. 3C, selected areas of inactive ligand coordination layer 102" are exposed to UV light through transparent regions of shadow mask 301. The illuminated areas of inactive ligand coordination layer 102" are transformed to activated regions comprising ligand coordinating sublayer 102'. In some embodiments, the transformation is accomplished by dosage with UV light energy, indicated by the vertical arrows. In some embodiments, the wavelength range of the UV light ranges between 150 nm to 300 nm, and may activate regions of ligand coordination layer 102" to form ligand coordinating sublayer regions 102' by cleavage of the protective group, unmasking the ligand coordinating moiety of the tether molecules. Specifically, the UV light energy cleaves C—C bonds or C—O bonds within the precursor tether molecules making up ligand coordination layer 102". In some embodiments, UV light is delivered by excimer laser, such as, but not limited to, ArF lasers (e.g., 193 nm), KrF lasers (e.g., 248 nm), XeBr lasers (e.g., 282 nm).

Figure 3D:
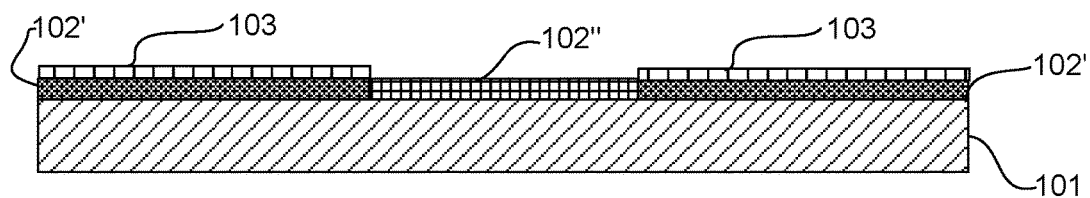

In FIG. 3D, catalyst layer 103 is formed over activated ligand coordination layer 102'. Catalyst layer 103 comprises metal ions or metal atoms complexed by the ligand coordination group. As described above, metals comprised by catalyst layer 103 exhibit catalytic activity toward electroless deposition of metals such as copper. Exemplary catalytic metals include, but are not limited to, palladium, platinum, osmium, ruthenium, rhodium, cobalt, titanium, copper and tin. The metals may have oxidation numbers greater than zero (complexed ionic), or have an oxidation number of zero (metallic).

In some embodiments, catalyst layer 103 is formed by exposure to ionic solutions of catalytic metal ions, such as aqueous solutions of $PdCl_2$. Uptake of the metal ions is complexation by the ligand coordination groups on the tether molecules. In some embodiments, metal ions are reduced to metal atoms. In some embodiments, catalyst layer 103 is formed by chemical vapor deposition of metal atoms. In some embodiments, catalyst layer 103 is substantially a monolayer. In some embodiments, catalyst layer 103 interpenetrates ligand coordinating sublayer 102'.

Figure 3E:
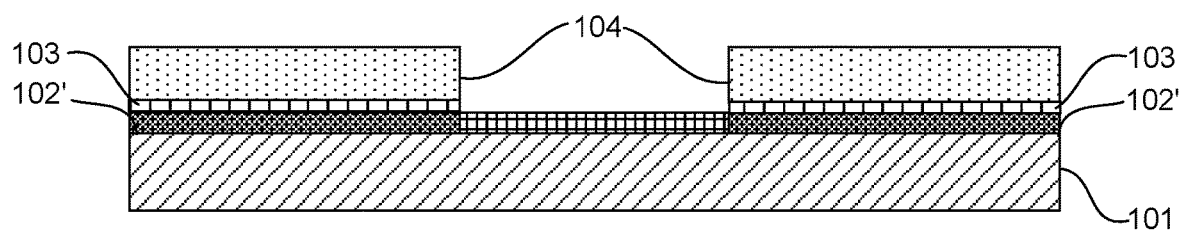

In FIG. 3E, metallization layer 104 is formed over catalyst layer 103. In some embodiments, metallization layer 104 is formed by electroless deposition initiated over catalyst layer 103. Metallization layer comprises metals such as, but not limited to, copper and copper alloys. Electroless deposition occurs only over catalyst layer 103, where the deposition process is initiated by catalytic metal ions or metal atoms contained in catalyst layer 103, and therefore site-specific. Conventional metallization processes employ deposition of a photoresist over a seed layer on package substrate dielectric 101, patterning the photoresist layer, involving a photolithography step and a development step, and either galvanic electroplating or electroless deposition in openings made in the photoresist layer. The site-selective metallization described in this disclosure eliminates the conventional photolithography steps, greatly simplifying the metallization process of package substrate 100b.

FIGS. 4A-4D illustrate a detailed view at the molecular level of negative pattern site-selective metallization of package substrate 100a, according to some embodiments of the disclosure.

Figure 4A:
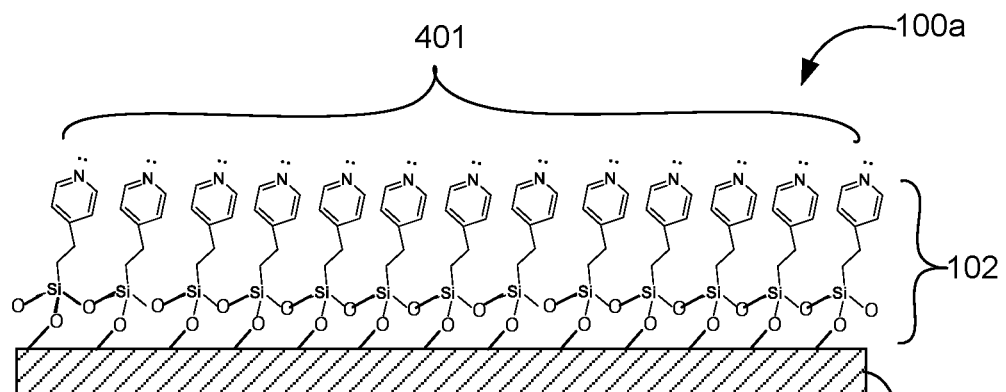
FIGS. 4A-4D illustrate a detailed view at the molecular level of positive pattern site-selective metallization of an IC package substrate, according to some embodiments of the disclosure.

In FIG. 4A, an exemplary depiction of the molecular organization of ligand coordinating layer 102 is shown, comprising molecules 401 of compound 3-(2-trimethoxysilanylethyl) pyridine (FIG. 2C), assembled into a monolayer on the surface of substrate dielectric 101. Molecules 401 are covalently bonded to surface hydroxyl groups of substrate dielectric 101 by their silyl anchor groups. In some embodiments, adjacent molecules 401 are cross-linked by side Si—O—Si linkages.

Figure 4B:
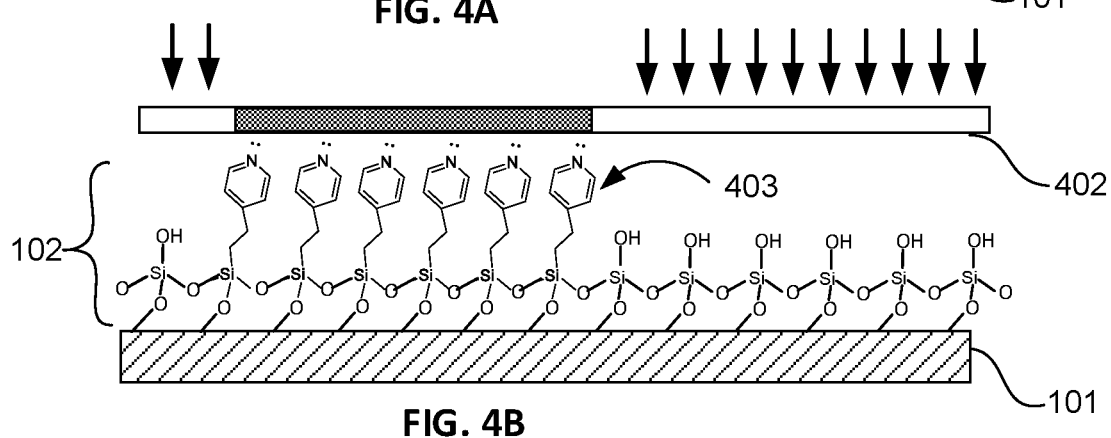

In FIG. 4B, ligand coordinating layer 102 is patterned by selective exposure to a deep UV light source. In the illustrated embodiment, a portion of ligand coordinating layer is removed by exposure to the UV light through shadow mask 402. Active region 403 of ligand coordinating layer 102 is protected from light exposure by shadow mask 402, and active. On a molecular level, the Si—C bond of molecules 401 is cleaved by UV light, removing the ligand-coordinating pyridyl moiety. Other photolytic mechanisms are possible. The photolyzed portions of ligand coordinating layer are deactivated toward complexation with catalytic ions.

Figure 4C:
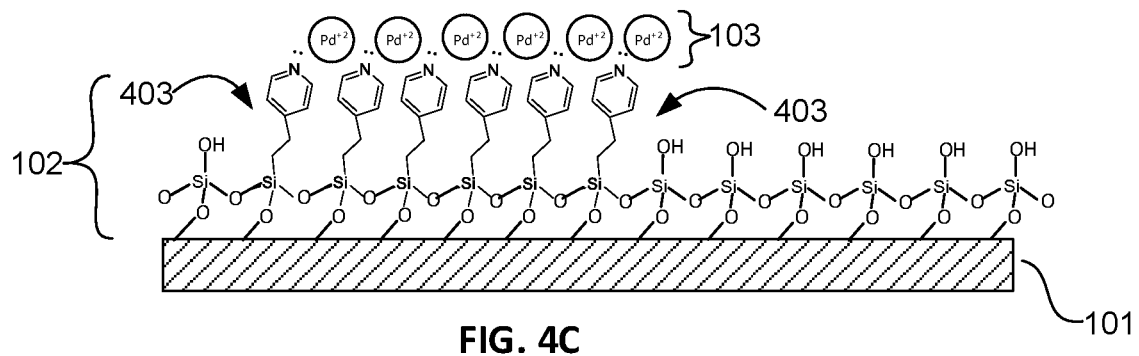

In FIG. 4C, $Pd^{2+}$ ions are complexed with the pyridyl groups of ligand coordinating layer 102, forming catalytic layer 103. In some embodiments, the catalytic $Pd^{2+}$ ions are confined within active region 403 of ligand coordinating layer 102, and not in the deactivated region.

Figure 4D:
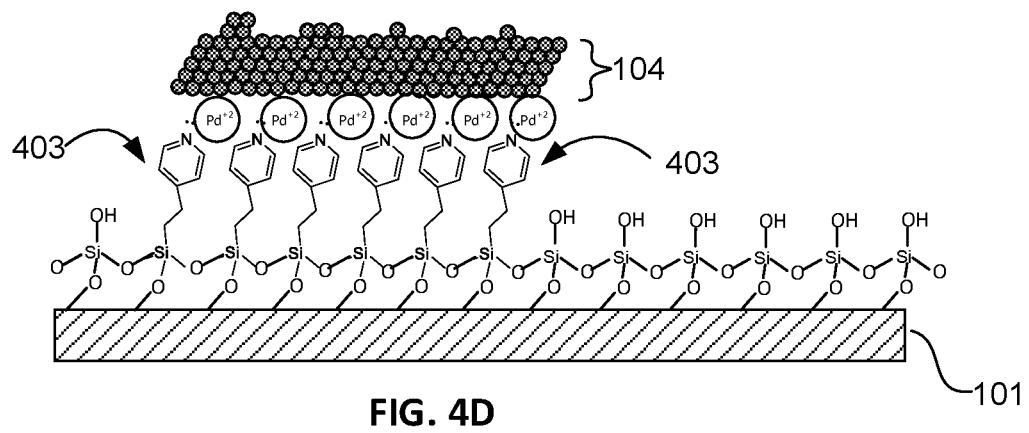

In FIG. 4D, metallization layer 104 is formed by an electroless deposition process, according to some embodiments. In some embodiments, electroless deposition is initiated by catalysis over the active region 403, where catalytic $Pd^{2+}$ ions are tethered to substrate dielectric 101. Adjacent pyridine groups may donate coordination bonds to form strong coordination bonds with the $Pd^{2+}$ ions. In some embodiments, metallization layer 104 is a layer of copper or alloys of copper.

FIGS. 5A-5D illustrate detailed views at the molecular level of positive pattern site-selective metallization of package substrate 100b, according to some embodiments of the disclosure.

Figure 5A:
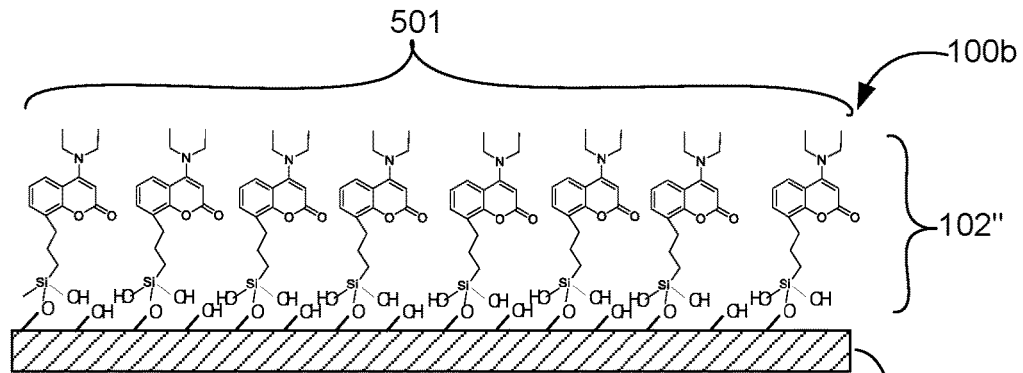
FIGS. 5A-5D illustrate a detailed view at the molecular level of negative pattern site-selective metallization of an IC package substrate, according to some embodiments of the disclosure.

In FIG. 5A, an exemplary depiction of the molecular organization of precursor ligand coordinating layer 102", comprising molecules 501 of compound 8-(3-trimethoxypropyl)-4-N, N-diethylaminocoumarin (205, FIG. 2E). In the illustrated embodiment, ligand coordinating layer 102" is assembled as a monolayer on the surface of substrate dielectric 101. Molecules 501 comprise a protected conformation of the ligand coordinating group, as described in detail above. In some embodiments, molecules 501 are covalently bonded to surface hydroxyl groups of substrate dielectric 101 by the silyl anchor groups.

Figure 5B:
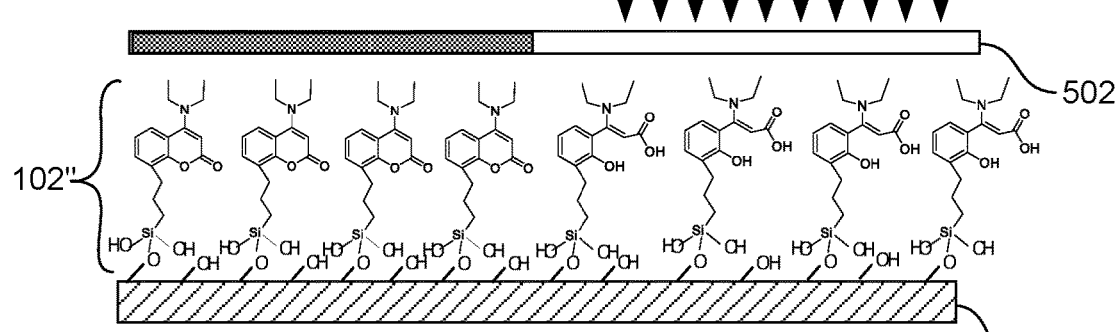

In FIG. 5B, inactive ligand coordinating layer 102" is patterned by selective exposure to a deep UV light source. In the illustrated embodiment, a portion of ligand coordinating layer is activated by exposure to the UV light source through shadow mask 502. Activated region 102' comprises deprotected ligand coordinating groups, in the form of opened acid anhydride ring moiety, freeing a carboxylic acid moiety and hydroxyl group. In some embodiments, molecules in the inactive region retain the protective group.

Figure 5C:
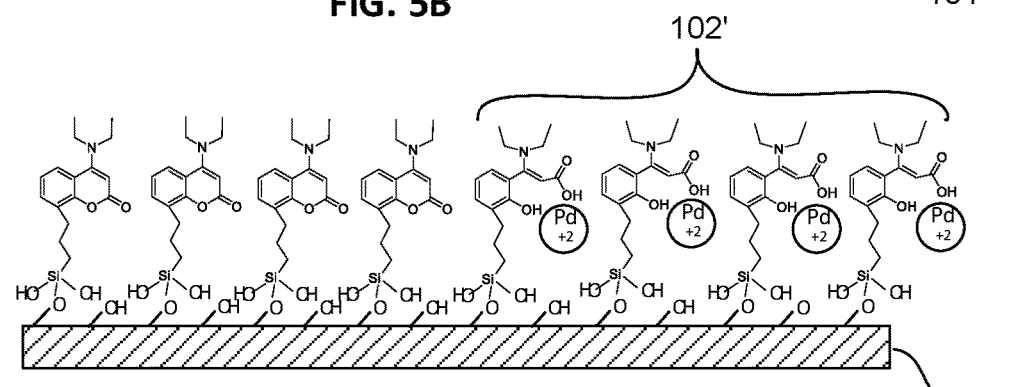

In FIG. 5C, $Pd^{2+}$ ions are complexed in activated region of ligand coordinating layer 102'. In the illustrated embodiment, the open ring structure presents a molecular geometry favorable to coordination of metal ions. Adjacent molecules may donate coordination bond to form complexes with $Pd^{2+}$ ions bound to the surface of substrate dielectric 101.

Figure 5D:
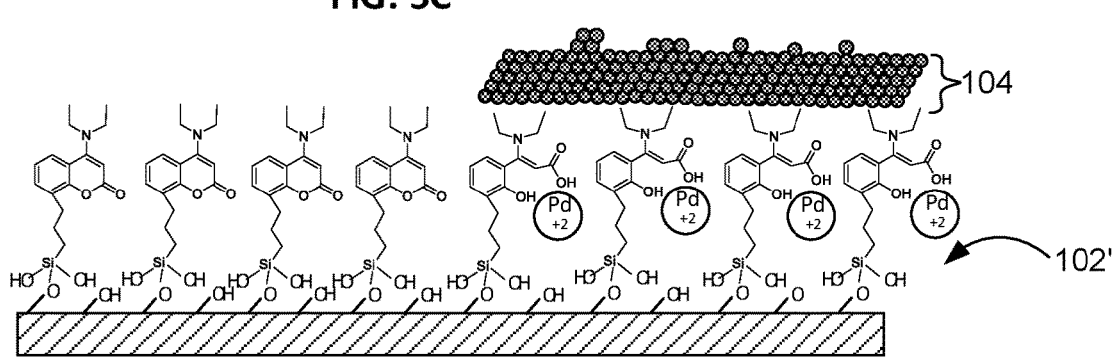

In FIG. 5D, metallization layer 104 is formed over active region of ligand coordinating layer 102', where catalytic ions (e.g., $Pd^{2+}$) are retained. In some embodiments, metallization layer 104 results from electroless deposition of copper or alloys of copper, silver or silver alloys, nickel or nickel alloys, gold or gold alloys, aluminum or aluminum alloys, iron or iron alloys, cobalt or cobalt alloys. In some embodiments, the aforementioned metals are deposited by vacuum deposition, or chemical vapor deposition.

Figure 6:
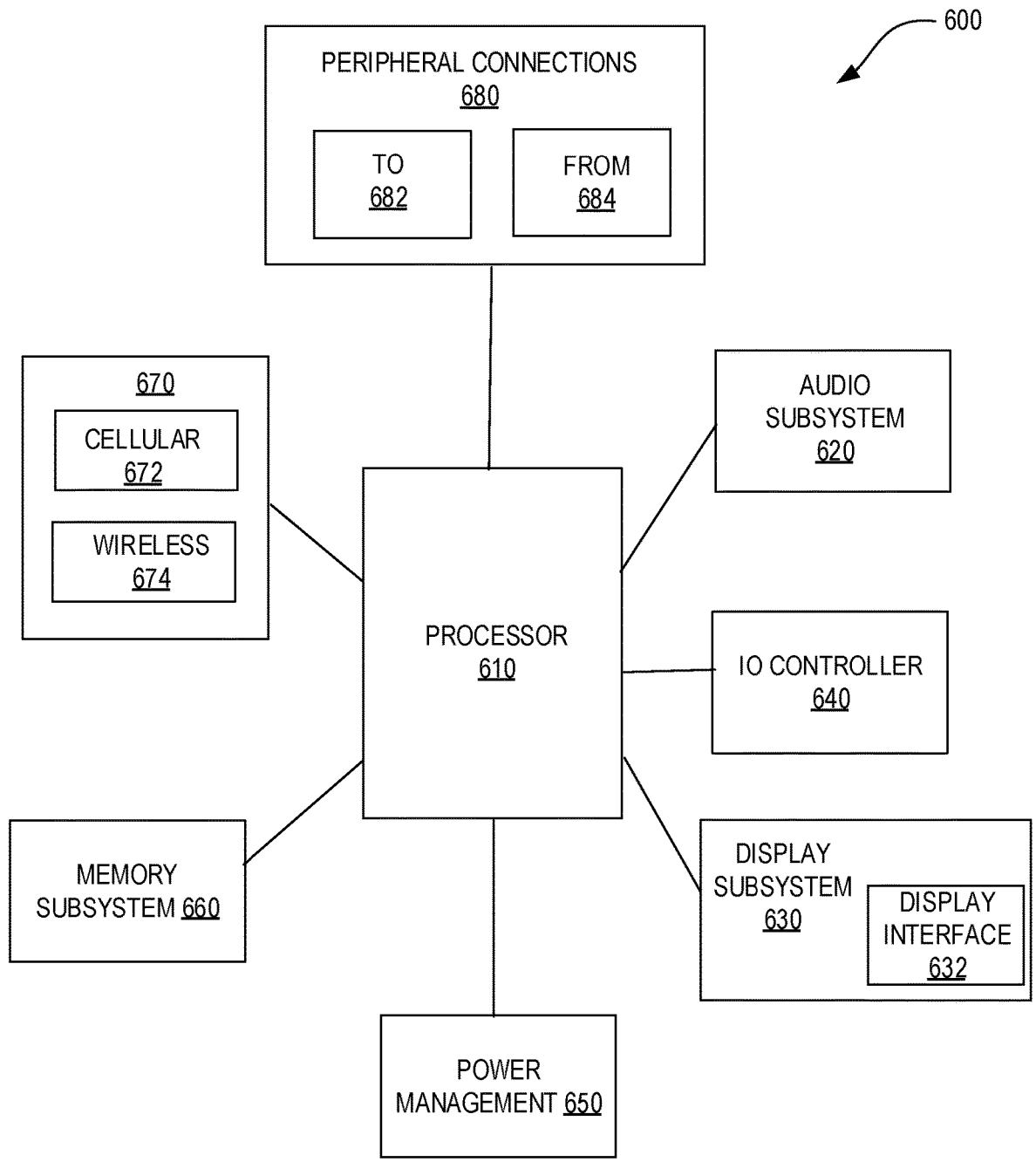
FIG. 6 illustrates a site-selective metallized IC package as part of a system-on-chip (SoC) package in an implementation of computing device, according to some embodiments of the disclosure.

FIG. 6 illustrates a site-selective metallized package as part of a system-on-chip (SoC) package in an implementation of computing device, according to some embodiments of the disclosure.

FIG. 6 illustrates a block diagram of an embodiment of a mobile device in which flat surface interface connectors could be used. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632 which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Network interface 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) package comprising an integrated substrate having a dielectric, a first structure over at least a portion of the dielectric, the first structure comprising a molecular compound including a ligand coordinating moiety, and a second structure over at least a portion of the first structure, the second structure comprising a metal, wherein the first structure is covalently bonded to the dielectric.

Example 2 includes all of the features of example 1, further comprising a metal ligand bonded to the ligand coordinating moiety.

Example 3 includes all of the features of example 2, wherein the metal ligand includes one or more of palladium, osmium, tin, silver, iridium, platinum, rhodium, ruthenium, copper or nickel.

Example 4 includes all of the features of any one of examples 1 through 3, wherein the molecular compound includes an anchor group covalently chemically bonded to the dielectric.

Example 5 includes all of the features of example 4, wherein the anchor group includes one of an alkoxysilane group, a chlorosilane group, or a thiol group.

Example 6 includes all of the features of any one of examples 1 through 5, wherein the molecular compound is covalently chemically bonded to the dielectric by an oxygen linkage from a silicon-oxygen moiety.

Example 7 includes all of the features of any one of examples 1 through 6, wherein at least part of the molecular compound includes one or more of: a pyridine, a terpyridine, a coumarin, and a dithiocarbamate, a nitrobenzene ring, a carboxylic acid, a carbamate, a carboxylate ester, or a nitrate group.

Example 8 includes all of the features of any one of examples 1 through 7, wherein the molecular compound having a ligand coordinating moiety is a first molecular compound, and wherein the first structure further comprises a second molecular compound.

Example 9 includes all of the features of example 8, wherein the second molecular compound includes a chemical derivative of the first molecular compound including a ligand coordinating moiety.

Example 10 includes all of the features of examples 8 or 9, wherein the ligand coordinating moiety of the second molecular compound is covalently bonded to a protective group.

Example 11 includes all of the features of example 10, wherein wherein the protective group is a molecule including one of an alkoxy moiety, an acid anhydride moiety, an oxo moiety, or an amino moiety.

Example 12 includes all of the features of any one of examples 8 through 10, wherein the first structure has a first region comprising the first molecular compound, and a portion of the second region comprising the second molecular compound is over the first structure.

Example 13 includes all of the features of example 12, wherein the metal ligand is chemically bonded to the first region.

Example 14 includes all of the features of examples 12 or 13, wherein the second structure is over the first region.

Example 15 includes all of the features of any one of examples 8 through 14, wherein portion of the second molecular compound is a N, N-diethylaminocoumarin or a nitrobenzoate ester.

Example 16 includes all of the features of any one of examples 1 through 15, wherein the second structure comprises a metal.

Example 17 includes all of the features of any one of examples 1 through 16, wherein the metal is any one of copper, copper alloys, silver, silver alloys, nickel, nickel alloys, gold, gold alloys, aluminum, aluminum alloys, iron, iron alloys, cobalt, or cobalt alloys.

Example 18 is a system, comprising a processor, and a memory coupled to the processor, the processor comprising an IC package comprising a substrate, the substrate having a dielectric, a first structure over at least a portion of the dielectric, the first structure comprising a molecular compound having a ligand coordinating moiety, and a second structure over at least a portion of the first structure, the second structure comprising a metal, wherein the first structure is chemically bonded to the dielectric, and a wireless interface to couple the processor to an external device.

Example 19 includes all of the features of example 18, wherein the molecular compound having a ligand coordinating moiety is a first molecular compound, and wherein the first structure further comprises a second molecular compound.

Example 20 includes all of the features of example 19, wherein the second molecular compound is a chemical derivative of the first molecular compound having a ligand coordinating moiety.

Example 21 includes all of the features of any one of examples 18 through 20, wherein a metal ligand is chemically bonded to the ligand coordinating moiety.

Example 22 includes all of the features of any one of examples 18 through 21, wherein the metal ligand is any one of palladium, osmium, tin, silver, iridium, platinum, rhodium, ruthenium, copper or nickel.

Example 23 is a method comprising forming a substrate comprising a dielectric, depositing a first structure comprising an organic molecular compound having a ligand coordinating moiety over the dielectric, patterning the first structure to form active regions for bonding an ionic ligand to the ligand coordinating moiety, bonding an ionic ligand to the ligand coordinating moiety within the active regions of the first structure, and depositing a second structure comprising a metal over the active regions of the first structure.

Example 24 includes all of the features of example 23, further comprising activating the dielectric prior to depositing the first structure.

Example 25 includes all of the features of example 24, wherein activating the dielectric comprises creating surface hydroxyl groups on the dielectric.

Example 26 includes all of the features of examples 24 or 25, wherein activating the dielectric comprises oxidizing the surface of the dielectric.

Example 27 includes all of the features of any one of examples 23 through 26, wherein depositing a first structure comprising a molecular compound having a ligand coordinating moiety over the dielectric comprises exposing the dielectric to a solution of the molecular compound having a ligand coordinating moiety.

Example 28 includes all of the features of example 27, wherein exposing the dielectric to a solution of the molecular compound having a ligand coordinating moiety comprises heating the solution having a temperature ranging between 20° C. to 100° C. for at least a portion of the exposure time.

Example 29 includes all of the features of example 27, wherein exposing the dielectric to a solution of the molecular compound having a ligand coordinating moiety comprises chemical vapor deposition of the molecular compound having a ligand coordinating moiety.

Example 30 includes all of the features of any one of examples 23 through 29, wherein patterning the first structure to form active regions comprises exposing selected regions of the first structure to UV light.

Example 31 includes all of the features of example 30, wherein patterning the first structure to form active regions comprises forming the active regions in the regions of the first structure exposed to UV light.

Example 32 includes all of the features of examples 30 or 31, wherein forming the active regions in the regions of the first structure exposed to UV light comprises photolyzing a protective group from the ligand coordinating moiety of the molecular compound.

Example 33 includes all of the features of example 30, wherein patterning the first structure to form active regions comprises forming the active regions in the regions of the first structure unexposed to UV light.

Example 34 includes all of the features of examples 30 or 33, wherein forming the active regions in the regions of the first structure exposed to UV light comprises photolyzing the ligand coordinating moiety from the molecular compound.

Example 35 includes all of the features of any one of examples 30 through 34, wherein exposing the selected regions of the first structure to light comprises illuminating with UV light having wavelengths ranging between 150 nm and 300 nm.

Example 36 includes all of the features of any one of examples 23 through 33, wherein bonding an ionic ligand to the ligand coordinating moiety within the active regions of the first structure comprises exposing the active regions of the first structure to a solution of the ionic ligand.

Example 37 includes all of the features of example 36, wherein the ionic ligand is selected from the group consisting of ions of palladium, osmium, tin, silver, iridium, platinum, rhodium, ruthenium, copper or nickel.

Example 38 includes all of the features of any one of examples 23 through 37, wherein depositing a second structure comprising a metal over the active regions of the first structure comprises electroless deposition of the metal over the active regions of the first structure.

Example 39 includes all of the features of example 38, wherein the metal is one of copper, copper alloys, silver, silver alloys, nickel, nickel alloys, gold, gold alloys, aluminum, aluminum alloys, iron, iron alloys, cobalt, or cobalt alloys.

Example 40 includes all of the features of any one of examples 23 through 38, wherein the ligand coordinating moiety is any one of a carboxylic group, a primary amino group, a secondary amino group, a tertiary amino group, an amido group, a hydroxyl group, an oxo group, an oxime, a pyridine ring, a phosphoryl group, a sulfuryl group, a sulfhydryl group and a nitro group.

Example 41 includes all of the features of any one of examples 23 through 40, wherein a protective group is bonded to the ligand coordinating group.

Example 42 includes all of the features of example 41, wherein the protective group is one of an alkoxy group, an acid anhydride, an oxo group, and an amino group.

Example 43 includes all of the features of any one of examples 23 through 42, wherein depositing a first structure comprising a molecular compound having a ligand coordinating moiety comprises binding a molecular compound having an anchor group onto the dielectric.

Example 44 includes all of the features of example 43, wherein the anchor group is any of a silyl group, a thiol group, or a thioketone group.

Example 45 includes all of the features of example 44, wherein depositing a molecular compound having an anchor group onto the dielectric comprises reacting the anchor group with hydroxyl groups on the dielectric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An integrated circuit (IC) package, comprising:
a substrate comprising a dielectric;
a molecular compound on a first region and a second region of the dielectric, wherein the molecular compound within the first region comprises a ligand coordinating moiety and an anchor group coupling the ligand coordinating moiety to the dielectric, but within the second region the ligand coordinating moiety is absent or blocked by a protective group; and
a metallization feature over the first region of the dielectric and absent from a second region of the dielectric, wherein the metallization feature comprises a seed metal bonded to the ligand coordinating moiety.

2. The IC package of claim 1, wherein the seed metal is one or more of palladium, osmium, tin, silver, iridium, platinum, rhodium, ruthenium, copper or nickel.

3. The IC package of claim 1, wherein the anchor group is one of an alkoxysilane group, a chlorosilane group, or a thiol group.

4. The IC package of claim 1, wherein the molecular compound comprises one or more of: a pyridine, a terpyridine, a coumarin, a dithiocarbamate, a nitrobenzene ring, a carboxylic acid, a carbamate, a carboxylate ester, or a nitrate group.

5. The IC package of claim 1, wherein, within only the second region of the dielectric, the molecular compound further comprises the protective group that hinders a bond between the seed metal to the ligand coordinating moiety.

6. The IC package of claim 5, wherein the ligand coordinating moiety is chemically bonded to the protective group.

7. The IC package of claim 5, wherein the protective group comprises an alkoxy moiety, an acid anhydride moiety, an oxo moiety, or an amino moiety.

8. The IC package of claim 1, wherein the metallization feature further comprises a layer comprising copper, silver, nickel gold aluminum, iron, or cobalt over the seed metal.

9. The IC package of claim 1, wherein the molecular compound includes one or more of: an N,N-diethylaminocoumarin, or a nitrobenzoate ester.

10. A system, comprising:
a processor; and
a memory coupled the processor, the processor comprising:
the integrated circuit (IC) package of claim 1.

11. A method, comprising:
forming a substrate comprising a dielectric;
depositing a first structure comprising an organic molecular compound having a ligand coordinating moiety coupled to the dielectric by an anchor group covalently bonded to the dielectric;
patterning the first structure to form active regions for bonding an ionic ligand to the ligand coordinating moiety;
bonding an ionic ligand comprising a seed metal to the ligand coordinating moiety within the active regions of the first structure; and
depositing a metal over the active regions of the first structure selectively relative to inactive regions of the first structure within which the ligand coordinating moiety is absent from the molecular compound, or is blocked by a protective group.

12. The method of claim 11, further comprising activating the dielectric prior to depositing the first structure, wherein activating the dielectric comprises creating surface hydroxyl groups on the dielectric.

13. The method of claim 11, wherein patterning the first layer to form active regions comprises:
photolyzing a protective group from the ligand coordinating moiety of the molecular compound; or
photolyzing the ligand coordinating moiety from the molecular compound.

14. The method of claim 11, wherein depositing the second structure comprising a metal over the active regions of the first structure comprises electroless deposition of the metal over the active regions of the first structure, and wherein the metal is any one of: copper, copper alloys, silver, silver alloys, nickel, nickel alloys, gold, gold alloys, aluminum, aluminum alloys, iron, iron alloys, cobalt, or cobalt alloys.

* * * * *